United States Patent
Wei et al.

(10) Patent No.: US 11,942,263 B2
(45) Date of Patent: Mar. 26, 2024

(54) SUPPORTABLE PACKAGE DEVICE AND PACKAGE ASSEMBLY

(71) Applicant: Silergy Semiconductor Technology (Hangzhou) LTD, Hangzhou (CN)

(72) Inventors: Jian Wei, Hangzhou (CN); Ke Dai, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 589 days.

(21) Appl. No.: 16/672,698

(22) Filed: Nov. 4, 2019

(65) Prior Publication Data

US 2020/0152372 A1    May 14, 2020

(30) Foreign Application Priority Data

Nov. 12, 2018   (CN) .......................... 201811337563.4

(51) Int. Cl.
| | |
|---|---|
| *H01F 27/29* | (2006.01) |
| *H01F 27/02* | (2006.01) |
| *H01F 27/24* | (2006.01) |
| *H01L 25/16* | (2023.01) |
| *H01L 49/02* | (2006.01) |

(52) U.S. Cl.
CPC .......... *H01F 27/29* (2013.01); *H01F 27/022* (2013.01); *H01F 27/24* (2013.01); *H01L 25/16* (2013.01); *H01L 28/10* (2013.01)

(58) Field of Classification Search
CPC ..... H01L 25/16; H01L 28/10; H01L 23/3107; H01L 23/495; H01L 2924/19102; H01L 2924/19042; H01L 2924/37001; H01F 27/29; H01F 27/28; H01F 27/022; H01F 27/24; H01F 2017/048; H01F 17/04; H01F 27/292; H01F 27/06; H01F 27/26; H01F 27/30; H01F 27/306; H01F 2027/065

See application file for complete search history.

(56) References Cited

U.S. PATENT DOCUMENTS

| | | | | |
|---|---|---|---|---|
| 5,068,712 | A | * 11/1991 | Murakami | .............. H01L 24/05 257/676 |
| 2006/0186975 | A1 | * 8/2006 | Wang | .................... H01F 17/045 335/83 |
| 2010/0038778 | A1 | 2/2010 | Lee et al. | |
| 2010/0072606 | A1 | 3/2010 | Yang | |
| 2010/0289609 | A1 | * 11/2010 | Liao | ......................... B22F 3/12 336/221 |
| 2013/0180766 | A1 | 7/2013 | Lee et al. | |
| 2015/0041982 | A1 | 2/2015 | Hau-Riege et al. | |
| 2015/0061139 | A1 | 3/2015 | Yap | |

(Continued)

FOREIGN PATENT DOCUMENTS

CN         102592781 A   * 7/2012   ............. H01F 27/24

Primary Examiner — Ermias T Woldegeorgis

(57) ABSTRACT

A package device can include: a package body having a support body and an encapsulating body configured to encapsulate a conductive body of the package device; at least one extraction electrode electrically connected to the conductive body, and having a part exposed outside the package body; and where the support body is located on only part of a bottom surface of the encapsulating body, and protrudes from the bottom surface of the encapsulating body to form a cavity defined by the remaining exposed bottom surface of the encapsulating body and inner side surface of the supporting body.

20 Claims, 14 Drawing Sheets

(56) References Cited

U.S. PATENT DOCUMENTS

2016/0086725 A1\* 3/2016 Igarashi .............. H01F 27/2823
336/83
2016/0093571 A1 3/2016 Kim et al.

\* cited by examiner

SUPPORTABLE PACKAGE DEVICE AND PACKAGE ASSEMBLY

RELATED APPLICATIONS

This application claims the benefit of Chinese Patent Application No. 201811337563.4, filed on Nov. 12, 2018, which is incorporated herein by reference in its entirety.

FIELD OF THE INVENTION

The present invention generally relates to the field of semiconductor package technology, and more particularly to package devices and assemblies.

BACKGROUND

Integrated circuit dice are typically packaged prior to being integrated with other electrical elements or devices in the manufacturing process. The package structure may at least provide sealing of dice, as well as provide electrical connectivity ports to external circuitry. For example, the package structure can provide electrical connectivity between dice and base board of electrical or electronic products, protection from pollution, mechanical support, heat dissipation, and also may reduce heat mechanical strain.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Figure 1:
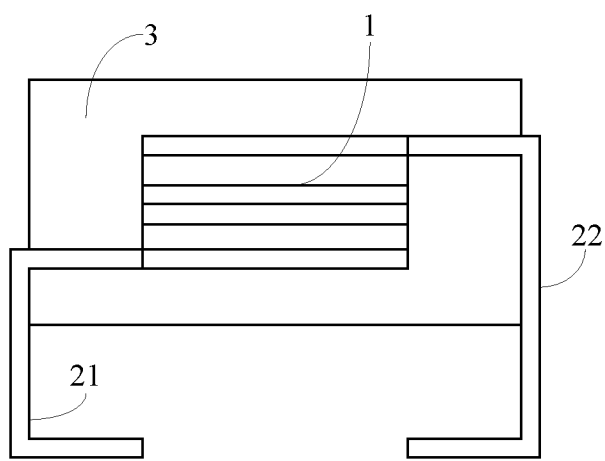
FIG. 1 is a diagram of an example supportable inductance structure.

Referring now to FIG. 1, shown is a diagram of an example supportable inductance structure, which can reduce the volume of the power module. Inductance can include coil 1, extraction electrode 21 electrically connected to a first end of coil 1, extraction electrode 22 electrically connected to a tail end of coil 1, and inductance magnet 3. Coil 1 can be packaged in inductance magnet 3, and extraction electrodes 21 and 22 may respectively be led out from the two sides of inductance magnet 3. Each of extraction electrodes 21 and 22 can extend a certain distance along the corresponding side surface to the bottom surface of inductance magnet 3 direction, and may be bent to form an outer pin that is bonded to the package carrier. Thus, it can be seen that when the inductance shown in FIG. 1 is mounted on a printed-circuit board (PCB), the inductance itself can mainly be supported by extraction electrodes 21 and 22. As such, there is a space between the inductance and the package carrier, and the space can be used to place other devices or chips in the power module. Accordingly, such an inductance with a supporting leg can reduce the area and volume of a package assembly, such as a power supply, in order to facilitate the improvement of power density.

This example, the extraction electrode may be used as the support leg of the package device. However, the extraction electrode can be relatively thin, and the extraction electrode may bend easily and deform during transportation and installation of the inductance, which may affect the yield of finished products. Moreover, the supportable package assembly can be applied to the power module, and when the power module is shaken, the extraction electrode may be easily deformed, which can cause power failure.

In particular embodiments, a supportable package device can include a package body, a conductive body, and at least one extraction electrode. The package body can include a support body and an encapsulating body configured to encapsulate the conductive body of the package device. At least one extraction electrode can be electrically connected to the conductive body, and part of which may be exposed outside the package body. For example, the support body can be located on only part of bottom surface of the encapsulating body, and may protrude from the bottom surface of the encapsulating body to form a cavity defined by the remaining exposed bottom surface of the encapsulating body and an inner side surface of the support body.

The package device in certain embodiments may be a semiconductor chip or a discrete component. When the package device is a semiconductor chip, the package body may be a plastic body formed by a plastic sealing process, the conductive body can be a semiconductor die (e.g., semiconductor bare die, unmolded die), and the extraction electrodes may be pins on a lead frame. For example, the semiconductor die can be electrically connected to a pin on the lead frame through a conductor. A portion of the extraction electrode may be located at a bottom end of the support body, or in a same plane as a bottom end of the support body, in order to facilitate the packaged device being electrically connected to an external assembly through the extraction electrode.

A portion of the extraction electrode may be located at a bottom end of the support body, or in a same plane as a bottom end of the support body. Thus, when the packaged device is electrically connected to an external assembly through the extraction electrode, the bottom end of the support body may be in contact with the external assembly. Also, the package assembly can be supported above the external assembly through the support body. As such, the weight of the package device itself can be prevented from being mainly supported by the extraction electrode, and the extraction electrode may not be easily deformed. The portion of the extraction electrode that is in the same plane as the bottom end of the support body may be in contact with the bottom end of the support body (e.g., the portion is located on a surface of the bottom end of the support body), or it may be located beside the bottom end of the support body (e.g., the two are not in contact).

In addition, the package device may also be a discrete component (e.g., an inductance, a capacitance, a resistance, etc.). In this case, the conductive body may be a core part of the discrete component. The core part can be encapsulated by the encapsulating body (e.g., the conductive body can be a coil part of the inductance, etc.). The encapsulating body and the support body may be integrally formed. For example, the package body can be a magnet formed by one-time pressing of magnetic metal powder. Further, in the process of forming the magnet, the gap in the conductive body may also be filled by the magnetic metal powder. That is, the conductive body can be embedded in the magnet.

For example, the package device can be an inductance, and the conductive body may be an inductance coil, where the "first" end of the conductive body may be the first end of the coil, and the "second" end of the conductive body may be the tail end of the coil. In other examples, if the conductive body is a semiconductor die, the first and second ends of the conductive body can be respective electrode pad terminals on the semiconductor die.

Figure 2:
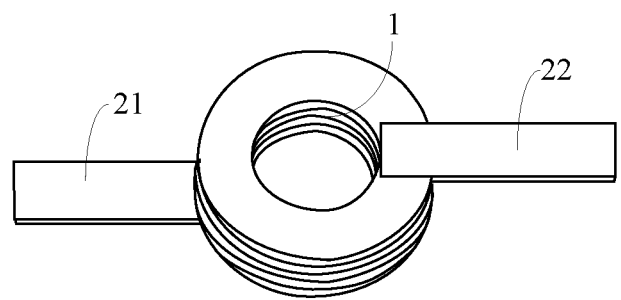
FIG. 2 is a diagram of a portion of an example conductor structure in a single phase inductance.

Referring now to FIG. 2, shown is a diagram of a portion of an example conductor structure in a single phase inductance. In this example, the conductor portion can include a conductive body and extraction electrodes. The conductive body can include coil 1, and the extraction electrodes can include extraction electrode 21 electrically connected to a first end of coil 1, and extraction electrode 22 electrically connected to the tail end of coil 1. It should be noted that the "first" end here may refer to one end of coil 1, and the "tail" end may refer to the other end of coil 1. Also, coil 1 may be a spiral coil formed of a conductor. Further, extraction electrodes 21 and 22 may be integrally formed with coil 1, or may be a sheet-shaped electrode welded to both ends of coil 1.

Figure 3:
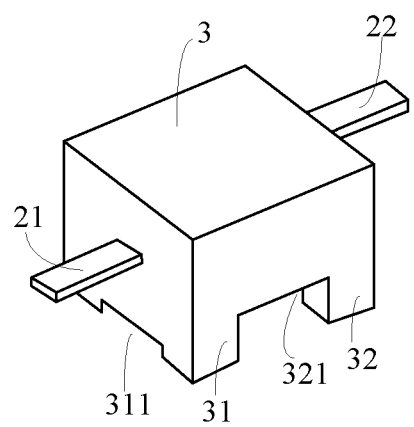
FIG. 3 is a diagram of an example single-phase supportable inductance semi-finished product structure, in accordance with embodiments of the present invention.

Referring now to FIG. 3, shown is a diagram of an example single-phase supportable inductance semi-finished product structure, in accordance with embodiments of the present invention. In this particular example, package body 3 can include a support body and an encapsulating body for encapsulating coil 1. The support body can be located on only part of bottom surface of the encapsulating body, and may protrude from the bottom surface of the encapsulating body to form a cavity defined by the remaining exposed bottom surface of the encapsulating body and inner side surface of the supporting body. The outer side surface of the support body may be conformal with that of the encapsulating body. Further, the support body can be located on at least two opposite parts of the bottom surface of the encapsulating body. Also, the supporting body can extend along the bottom surface of the encapsulating body from the outer side surface to inner part of the bottom surface of the encapsulating body, where the extending length is not less than 1 mm.

For example, the support body can include support body 31 and support body 32. The first end surface of the support body can include a first end surface of support body 31 and a first end surface of support body 32. The second end surface of the support body can include a second end surface of support body 31 and a second end surface of support body 32. A first end surface of the support body may be in contact with a bottom surface of the encapsulating body, and a second end surface of the support body can be a bottom surface of the support body. That is, the first end surface of support body 31 and the first end surface of support body 32 may both be in contact with a bottom surface of the encapsulating body (e.g., the remaining portions of package body 3 in FIG. 3 except for support body 31 and support body 32, which can be a regular cuboids, cylinder, etc.).

When the inductance shown in FIG. 3 is electrically connected to an external assembly, the bottom surface of the encapsulating body can be directed toward the external assembly. Also, the second end surface of support body 31 and the second end surface of support body 32 may both be raised with respect to a bottom surface of the encapsulating body by a predetermined height. The predetermined height may be determined according to a height of the component to be subsequently installed between the bottom surface of the encapsulating body and an external assembly. That is, the predetermined height can be greater than the height of the component to be installed. The external assembly here may be a lead frame or a printed circuit board, and the component to be installed may be a semiconductor bare die or a discrete electronic component, or the like.

As shown in FIGS. 2 and 3, the first end of the extraction electrode can include a first end of extraction electrode 21 and a first end of extraction electrode 22, and the second end of the extraction electrode can include a second end of extraction electrode 21 and a second end of extraction electrode 22. For example, the first end of extraction electrode 21 and the first end of extraction electrode 22 may be electrically connected to the first end and the tail end of coil 1, respectively. Also, at least part of extraction electrode 21 and at least part of extraction electrode 22 may be exposed by package body 3.

Figure 4:
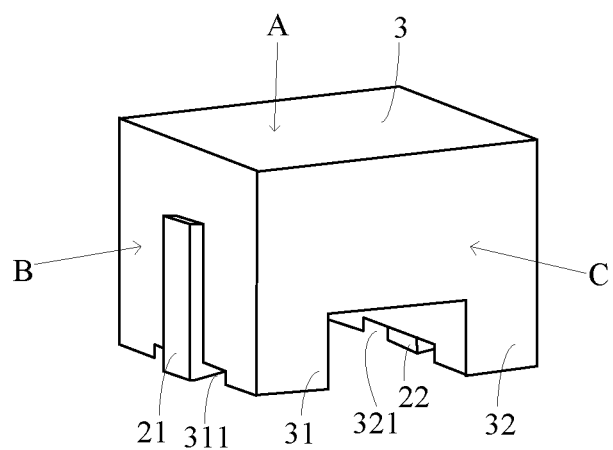
FIG. 4 is a structural diagram of an example single-phase supportable inductance structure, in accordance with embodiments of the present invention.
Figure 5:
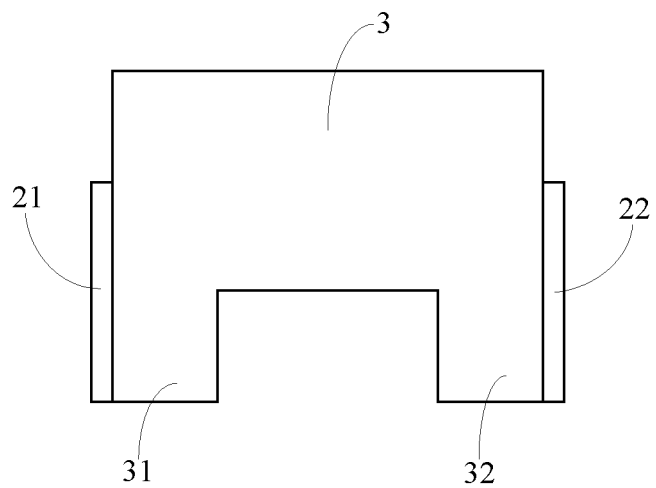
FIG. 5 is a front view of the example of FIG. 4, in accordance with embodiments of the present invention.
Figure 6:
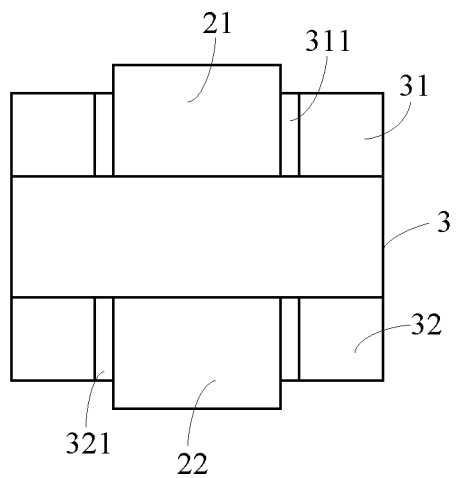
FIG. 6 is a bottom view of the example of FIG. 4, in accordance with embodiments of the present invention.
Figure 7:
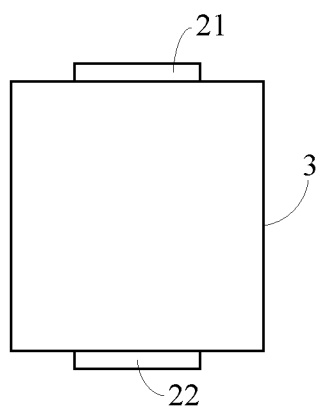
FIG. 7 is a top view of the example of FIG. 4, in accordance with embodiments of the present invention.
Figure 8:
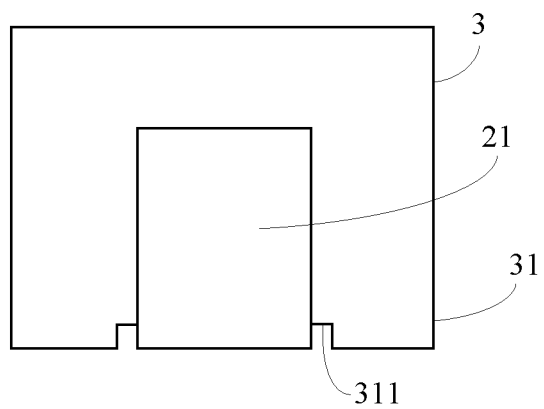
FIG. 8 is a side view of the example of FIG. 4, in accordance with embodiments of the present invention.

Referring now to FIG. 4, shown is a structural diagram of an example single-phase supportable inductance structure, in accordance with embodiments of the present invention. Referring also to FIG. 5, shown is a front view of the example of FIG. 4, in accordance with embodiments of the present invention. Referring also to FIG. 6, shown is a bottom view of the example of FIG. 4, in accordance with embodiments of the present invention. Referring also to FIG. 7, shown is a top view of the example of FIG. 4, in accordance with embodiments of the present invention. Referring also to FIG. 8, shown is a side view of the example of FIG. 4, in accordance with embodiments of the present invention.

After the conductor portion (see, e.g., FIG. 1) is wrapped by the package body, a diagram of a supportable inductance structure formed by further bending the extraction electrode is shown in FIG. 4. In order to show the inductance structure in FIG. 4 more clearly, FIGS. 5 to 8 respectively show plan views of the inductance of FIG. 4 as seen from various directions. FIG. 5 is a view (e.g., front view) seen from the direction of arrow C in FIG. 4, and FIG. 6 is a view (e.g., bottom view) seen from the opposite direction of arrow A in FIG. 4. FIG. 7 is a view (e.g., top view) seen from the direction of the arrow A in FIG. 4, and FIG. 8 is a view (e.g., side view) seen from the direction of arrow B in FIG. 4. On the basis of the semi-finished product shown in FIG. 3, the portion of extraction electrode 21 exposed by package body 3 can be bent to bottom surface of the support body, such that at least a first part of the extraction electrode is exposed on the bottom surface of the support body, and a second part of the extraction electrode is exposed on the side surfaces of the package body. Also, the first part and the second part of the extraction electrode can be connected together, where the a first part of the extraction electrode may include the second end of extraction electrode.

Extraction electrode 21 may extend along the first side of package body 3 to bottom surface of the support body such that a lower surface of a first part of extraction electrode 21 and the bottom surface of support body 31 are in the same plane. Similarly, the portion of extraction electrode 22 exposed by package body 3 can be bent in the direction of the second end of the support body 32. Extraction electrode 22 can extend along the second side of the package body to bottom surface of the support body, such that a lower surface of a first part of extraction electrode 22 and the bottom surface of support body 32 are in the same plane.

In order to make the extraction electrodes and the corresponding support bodies better engage, as shown in FIGS. 3 and 4, the second ends of the support bodies may be provided with grooves, for example. Groove 311 can be located at the second end surface of support body 31, and groove 321 may be located at the second end surface of support body 32. When the extraction electrodes is bent, the first part of extraction electrode 21 can be buckled in groove 311, and the first part of extraction electrode 22 can be buckled in groove 321. For example, "buckled" as described herein can indicate any suitable type of securing, fastening, and/or attaching in the given groove. Extraction electrodes 21 and 22 may be provided with a solder layer such that extraction electrodes 21 and 22 are soldered to package body 3, and subsequently are electrical connected to the external assembly by soldering.

As can be seen in the example of FIG. 4, since the package body includes support bodies which are convex relative to the low surface of a encapsulating body, in addition to the encapsulating body for encapsulating the conductive body, each of the support bodies can be located on only part of bottom surface of the encapsulating body. Also, at least part of the extraction electrode may be exposed on the bottom surface of the support body, and the bottom surface of the support body is away from the encapsulating body. When the package device is electrically connected to the external assembly, there may be no need to take the electrode itself to support the weight of the entire packaged device, and instead the package device can be supported by the support body of the package body itself.

Therefore, when the supportable package device is mounted on an external assembly, the bottom surface of the encapsulating body may face the external assembly. Also, the second end surface (e.g., bottom surface) of each of the support bodies can be in contact with the external assembly, and the second end of each of the extraction electrodes may be electrically connected to the external assembly. The package device can be supported above the external assembly by each of the support bodies, and there may be a space between the encapsulating body and the external assembly for accommodating other components (e.g., semiconductor bare dies or discrete electronic components). This can be conducive to space saving, and reducing possible damage of the extraction electrode, along with having a relatively high production quality rate and reliability.

In the example supportable package device shown in FIG. 4, the bending process of each of the extraction electrodes may be performed after package body 3 is formed. Therefore, the second part of each of the extraction electrodes (e.g., the second part of extraction electrode 21 and second part of extraction electrode 22) can be located outside package body 3 such that subsequent bending process may be performed. In FIG. 4, each of the second parts can be in contact with side surfaces of package body 3. In other examples, each of the second parts may not be in contact with each side surface of package body 3.

In addition, it should be noted that the side surfaces of package body 3 can include side surfaces of the encapsulating body and side surfaces of each of the support bodies, where side surfaces of the encapsulating body are adjacent to a bottom surface of the encapsulating body. The side surfaces of the support bodies can be located between the first end surface of the support bodies and the second end surface of the support bodies. For example, a first side surface of package body 3 can include a first side surface of support body 31 and a first side surface of the encapsulating body. In one example, the second part of extraction electrode 21 may be located on the first side surface of package body 3. Similarly, a second side surface of package body 3 can include a first side surface of support body 32 and a second side surface of the encapsulating body. In one example, the second part of second extraction electrode 22 can be located on the second side surface of package body 3. For example, the first side surface of the encapsulating body may be opposite to the second side surface of the encapsulating body, and the first side surface of package body 3 may be opposite to the second side surface of package body 3.

In other examples, the second part of each of the extraction electrodes may be not exposed by package body 3. In this case, it may be necessary to bend each of the extraction electrodes before wrapping the conductor structure shown in FIG. 1 with package body 3, such that the second end of each of the extraction electrodes can be bent to a plane. For example, the plane is coplanar with a plane of the second end surface of the subsequently formed support bodies. In this case, the second part of each of the extraction electrodes can include one portion extending in the encapsulating body and the other portion extending in the supporting bodies. Also, the other portion of the extraction electrode may be exposed at the bottom surface of the support body.

Continuing with FIGS. 3 and 4, the encapsulating body and the support body of the package body may be integrally formed. For example, the conductor structure in FIG. 2 can be placed in a pre-machined metal mold according to a predetermined position, and then the conductor structure and the magnetic metal powder shown in FIG. 2 may be press-molded into a structure as shown in FIG. 3 by a powder core press. That is, the package body can be a magnet that is once press molded of magnetic metal powder. The conductive body of the supportable package device may be applicable not only to devices including only one conductive body, but also to devices including a plurality of conductive bodies. For example, two or more multi-phase inductance structure, as opposed to strictly a single-phase inductance shown in FIG. 4 may be supported in certain embodiments.

Figure 9:
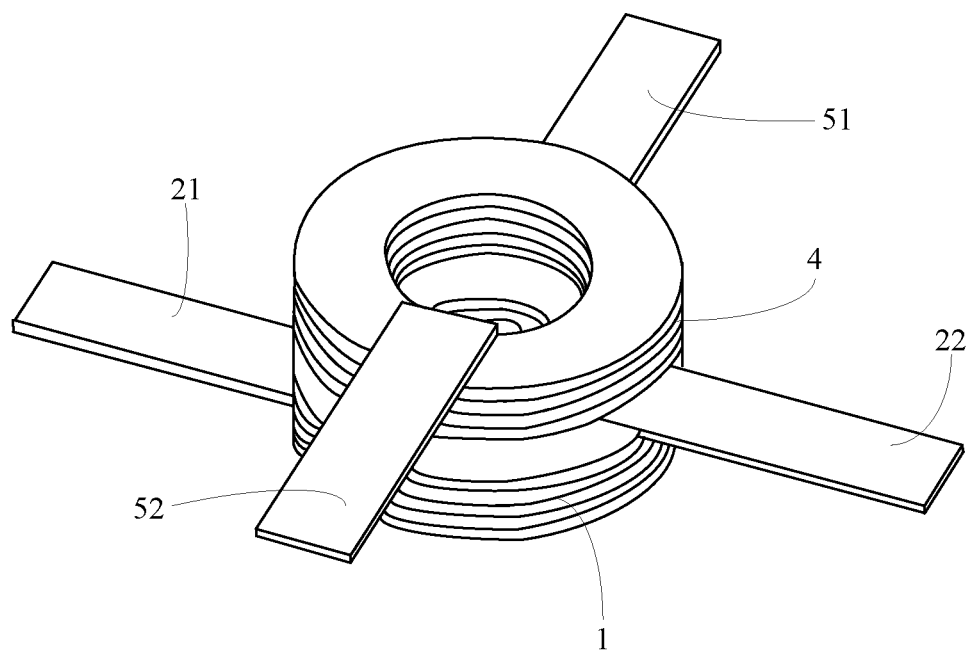
FIG. 9 is a diagram of a portion of an example conductor structure in a two-phase inductance, in accordance with embodiments of the present invention.
Figure 10:
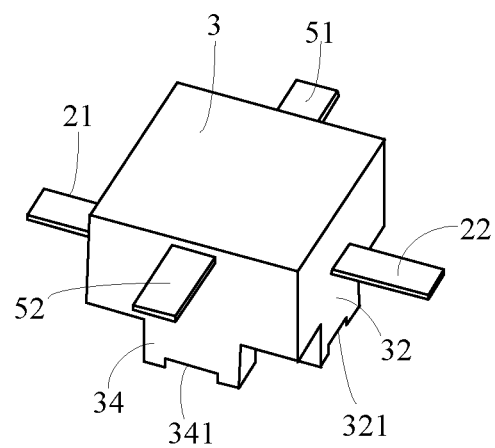
FIG. 10 is a diagram of an example two-phase supportable inductance semi-finished product structure, in accordance with embodiments of the present invention.
Figure 11:
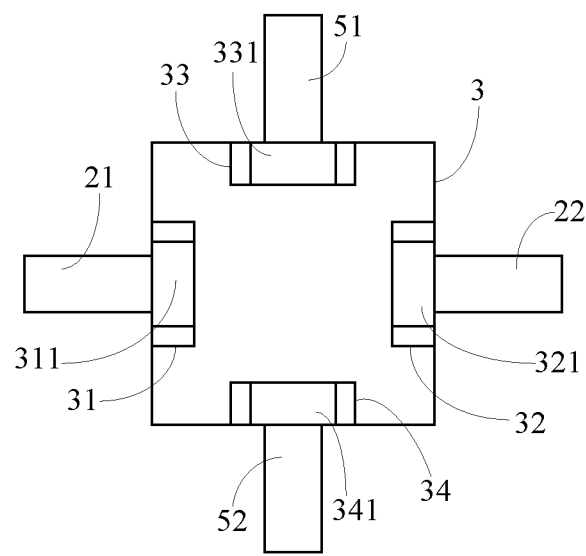
FIG. 11 is a bottom view of the example of FIG. 10, in accordance with embodiments of the present invention.

Referring now to FIG. 9, shown is a diagram of a portion of an example conductor structure in a two-phase inductance, in accordance with embodiments of the present invention. Referring also to FIG. 10, shown is a diagram of an example two-phase supportable inductance semi-finished product structure, in accordance with embodiments of the present invention. Referring also to FIG. 11, shown is a bottom view of the example of FIG. 10, in accordance with embodiments of the present invention. As shown in FIGS. 9-11, in a two-phase supportable inductance, the first conductive body can include coil 1 as shown in FIG. 1, and the second conductive body can include coil 4 coupled to coil 1. The supportable package device may further include extraction electrodes 51 and 52. A first end of extraction electrode 51 can connect to a first end of coil 4, and a first end of extraction electrode 52 can connect to a tail end of coil 4. In addition, the support body can also include support body 33 and support body 34. A first end of the support body may further include a first end of support body 33 and a first end of support body 34. A second end of the support body may further include a second end of support body 33 and a second end of support body 34. Similarly, the second end surface of support body 33 and the second end surface of support body 34 can be respectively provided with grooves 331 and 341.

The first part of extraction electrode 51 may be in contact with the second end surface of support body 33, and in the same plane. For example, the first part of extraction electrode 51 can be buckled in groove 331. The first part of extraction electrode 52 may be in contact with the second end surface of support body 34, and in the same plane. Also, the first part of extraction electrode 52 can be buckled in groove 341. The positional relationship between extraction electrode 51 and package body 3 may be the same as the positional relationship between extraction electrode 21 and package body 3. Also, the positional relationship between extraction electrode 52 and package body 3 may be the same as the positional relationship between extraction electrode 22 and package body 3. In order to make the coupling coefficient between coils 1 and 4 relatively large, coils 1 and 4 can be placed in the package body 3 in stacked layers. However, in some applications, the coupling coefficients of the two coils of the two-phase inductance may be required to be relatively small. In this case, coils 1 and 4 may be arranged side by side with a certain distance between them, as shown in FIGS. 12 and 13.

Figure 12:
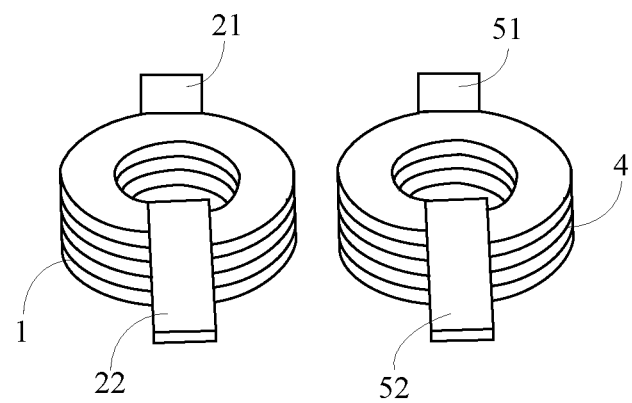
FIG. 12 is a diagram of a portion of an example conductor structure in another two-phase inductance, in accordance with embodiments of the present invention.
Figure 13:
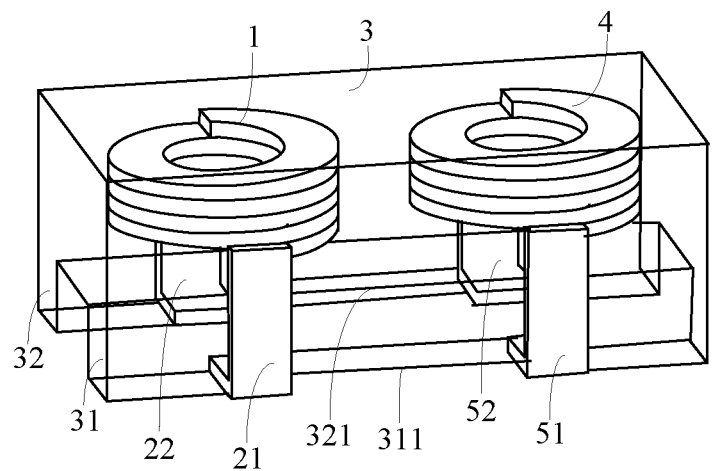
FIG. 13 is a diagram of another example two-phase supportable inductance, in accordance with embodiments of the present invention.

Referring now to FIG. 12, shown is a diagram of a portion of an example conductor structure in another two-phase inductance, in accordance with embodiments of the present invention. Referring also to FIG. 13, shown is a diagram of another example two-phase supportable inductance, in accordance with embodiments of the present invention. In this particular example, the number and arrangement of the support bodies of package body 3 can be the same as those in FIG. 4. That is, support bodies 31 and 32, and a first part of extraction electrode 51 may be in contact with one of the second end surface of support body 31 and the second end surface of support body 32, and can be in same plane. A first part of extraction electrode 51 may be in contact with the other one of the second end surface of support body 31 and the second end surface of support body 32, and can be in same plane. The first part of extraction electrode 51 and the first part of extraction electrode 52 can respectively be buckled in the groove of the corresponding supporting body.

Figure 14:
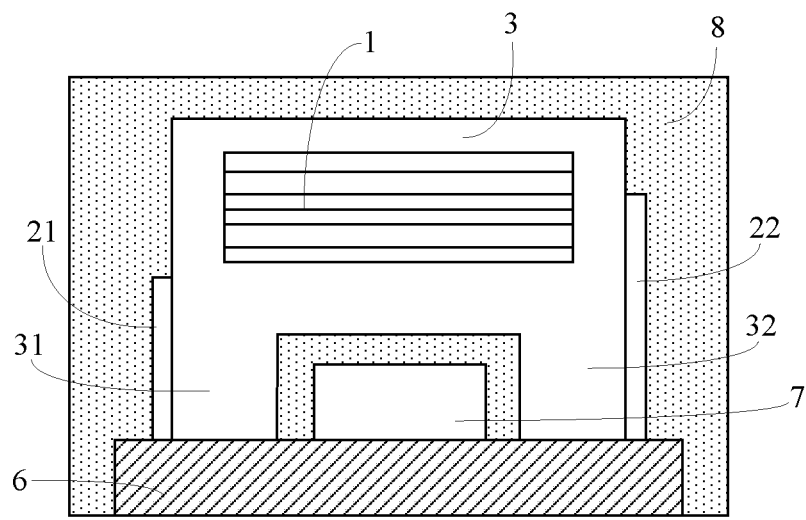
FIG. 14 is a diagram of an example package assembly, in accordance with embodiments of the present invention.

Referring now to FIG. 14, shown is a diagram of an example package assembly, in accordance with embodiments of the present invention. Particular embodiments may provide a package assembly including the supportable package device according to any of the examples described herein. The structure of the example package assembly shown in FIG. 14 can include assembly 6 and component 7. The package device can be located on assembly 6. The second end surface of the support body 31 and the second end surface of the support body 32 can be in contact with assembly 6, and extraction electrodes 21 and 22 may be electrically connected to assembly 6. The encapsulating body may be supported above assembly 6 by the support body, where there is a space between the bottom surface of the encapsulating body, the support body, and component 6. Component 7 may be located on assembly 6 and within the space. Further, the package assembly can include encapsulating body 8 that fills a gap between the inductance and component 7, and encapsulates the inductance. Assembly 6 may be configured as a lead frame or a PCB, and component 7 can be configured as a semiconductor bare die or a discrete electronic component. For example, the package assembly can be a package assembly in a power module, and component 7 can be a control chip or a power switch transistor in the power module.

In certain embodiments, since a package body of the package device includes a encapsulating body for encapsulating the coil, and a support body protruding relative to the bottom surface of the encapsulating body, each of the support bodies may be located at the bottom surface of the encapsulating body. Also, the extraction electrode can be exposed on the bottom surface of the support body. Thus, when the package device is electrically connected to the external assembly, the package device can mainly be supported by the support body of the package body itself. Therefore, the package assembly including the exemplified supportable package device can save space, and reduce the possibility of damage of the extraction electrode, as well as having a high production yield and reliability.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:
1. A package device, comprising:
a) a package body having a support body and an encapsulating body configured to encapsulate a conductive body of the package device;
b) at least one extraction electrode electrically connected to the conductive body, and having a part exposed outside the package body;
c) wherein the support body is located on only part of a bottom surface of the encapsulating body, and protrudes from the bottom surface of the encapsulating body to form a cavity defined by the remaining exposed bottom surface of the encapsulating body and inner side surface of the supporting body; and
d) wherein the bottom surface of the support body is provided with a groove portion, the groove portion is substantially centered in an outer side surface of the support body to which the cavity does not extend, a part of the extraction electrode is buckled in the groove portion, and a width of the groove portion is greater than a width of the part of the extraction electrode, wherein the groove portion does not extend into the cavity.

2. The package device of claim 1, wherein the outer side surface of the support body is conformal with that of the encapsulating body.

3. The package device of claim 2, wherein the support body extends along the bottom surface of the encapsulating body from the outer side surface to inner part of the bottom surface of the encapsulating body.

4. The package device of claim 3, wherein the extending length of the support body is not less than 1 mm.

5. The package device of claim 1, wherein at least a first part of the extraction electrode is exposed on the bottom surface of the support body.

6. The package device of claim 5, wherein a second part of the extraction electrode is exposed on the side surfaces of the package body, and the first and second parts of the extraction electrode are connected together.

7. The package device of claim 1, wherein:
a) the conductive body comprises a first conductive body;
b) the extraction electrode comprises a first and second extraction electrodes;
c) the support body comprises a first and second support bodies;
d) a first end of the first extraction electrode is electrically connected to a first end of the first conductive body;
e) a first end of the second extraction electrode is electrically connected to the second end of the first conductive body;
f) at least part of the first extraction electrode is exposed on a bottom surface of the first support body; and
g) at least part of the second extraction electrode is exposed on a bottom surface of the second support body.

8. The package device of claim 7, wherein:
a) the conductive body further comprises a second conductive body;
b) the extraction electrode comprises a third and fourth extraction electrodes;
c) a first end of the third extraction electrode is electrically connected to a first end of the second conductive body;
d) a first end of the fourth extraction electrode is electrically connected to a second end of the second conductive body;
e) at least part of the third extraction electrode is exposed on the bottom surface of one of the first and second support bodies; and
f) at least part of the fourth extraction electrode is exposed on the bottom surface of the other of the first and second support bodies.

9. The package device of claim 7, wherein:
a) the conductive body further comprises a second conductive body;
b) the extraction electrode further comprises third and fourth extraction electrodes;
c) the support body further comprises third and fourth support bodies;
d) the third and fourth support bodies both protrude with the predetermined height relative to the bottom surface of the encapsulating body;
e) a first end of the third extraction electrode is electrically connected to the first end of the second conductive body;

f) a first end of the fourth extraction electrode is electrically connected to a second end of the second conductive body;
g) at least part of the third extraction electrode is exposed on a bottom surface of the third support body; and
h) at least part of the fourth extraction electrode is exposed on a bottom surface of the fourth support body.

10. The package device of claim 7, wherein:
a) the package device is configured as an inductance;
b) the first conductive body is configured as a first coil;
c) a first end of the first conductive body is configured as a first end of the first coil; and
d) a second end of the first conductive body is configured as a tail end of the first coil.

11. A package assembly, comprising the packaged device of claim 1, and further comprising a first assembly and a second component, wherein:
a) the package device is located on the first assembly;
b) a bottom surface of the support body is in contact with the first assembly;
c) the extraction electrode is electrically connected to the first assembly;
d) the package device is supported above the first assembly by the support body;
e) a space exists between a bottom surface of the encapsulating body, the support body, and the first assembly; and
f) the second component is located on the first assembly and in the space.

12. The package assembly of claim 11, further comprising an encapsulant that fills a gap between the package device and the second component, and encapsulates the package device.

13. The package assembly of claim 11, wherein the first assembly is configured as a lead frame or a printed circuit board.

14. The package assembly of claim 11, wherein the package assembly is an assembly in a power module, and the second component is a control chip or a power switch transistor in the power module.

15. The package device of claim 1, wherein the support body is located on at least two opposite parts of the bottom surface of the encapsulating body.

16. The package device of claim 1, wherein the encapsulating body and the support body are integrally formed.

17. The package device of claim 1, wherein the package body comprises a magnet formed by one-time pressing of magnetic metal powder.

18. The package device of claim 1, wherein the package device comprises a semiconductor die or a discrete component.

19. The package device of claim 1, wherein:
a) the extraction electrode comprises a first part extending in the encapsulating body, and a second part extending in the support body; and
b) the bottom surface of the second part is exposed by the bottom surface of the support body.

20. The package device of claim 1, wherein the bottom surface of the support body is on a same plane as the bottom surface of the extraction electrode.

* * * * *